(12) United States Patent
Chang

(10) Patent No.: US 11,923,657 B2
(45) Date of Patent: Mar. 5, 2024

(54) LASER DIODE DRIVER FOR MULTI-LEVEL OPTICAL SIGNAL AND MULTI-LEVEL OPTICAL SIGNAL TRANSMISSION DEVICE INCLUDING THE SAME

(71) Applicant: SOLiD, INC., Seongnam-si (KR)

(72) Inventor: Won Song Chang, Goyang-si (KR)

(73) Assignee: SOLiD, INC., Seongnam-si (KR)

( * ) Notice: Subject to any disclaimer, the term of this patent is extended or adjusted under 35 U.S.C. 154(b) by 680 days.

(21) Appl. No.: 17/141,505

(22) Filed: Jan. 5, 2021

(65) Prior Publication Data
US 2021/0218222 A1 Jul. 15, 2021

(30) Foreign Application Priority Data

Jan. 9, 2020 (KR) .................... 10-2020-0003373

(51) Int. Cl.
*H01S 5/042* (2006.01)
*H04B 10/50* (2013.01)
*H04B 10/516* (2013.01)

(52) U.S. Cl.
CPC ........... *H01S 5/042* (2013.01); *H04B 10/503* (2013.01); *H04B 10/5161* (2013.01)

(58) Field of Classification Search
USPC ...................................... 372/38.02
See application file for complete search history.

(56) References Cited

U.S. PATENT DOCUMENTS

| 7,626,442 B2 | 12/2009 | Zerbe et al. |
| 10,171,281 B2 | 1/2019 | Dickson et al. |
| 2014/0016404 A1 * | 1/2014 | Kim ...................... G11C 11/165 365/158 |

* cited by examiner

*Primary Examiner* — Tuan N Nguyen
(74) *Attorney, Agent, or Firm* — Sughrue Mion, PLLC

(57) ABSTRACT

Provided are a laser diode driver for a multilevel optical signal and a multilevel optical signal transmission device including the same, wherein the laser diode driver includes: a clock generator configured to generate and output a clock signal; a first latch configured to delay output of data corresponding to a first timing of the clock signal from among data sequentially input at each data input period; a second latch configured to delay output of data corresponding to a second timing of the clock signal from among data sequentially input at each data input period; a first synchronization processor configured to output a signal corresponding to the data input by the first latch according to the clock signal; and a second synchronization processor configured to output a signal corresponding to the data input by the second latch according to the clock signal.

8 Claims, 3 Drawing Sheets

LASER DIODE DRIVER FOR MULTI-LEVEL OPTICAL SIGNAL AND MULTI-LEVEL OPTICAL SIGNAL TRANSMISSION DEVICE INCLUDING THE SAME

CROSS-REFERENCE TO RELATED APPLICATION

This application claims the benefit of Korean Patent Application No. 10-2020-0003373, filed on Jan. 9, 2020, in the Korean Intellectual Property Office, the disclosures of which are incorporated herein in its entirety by reference.

BACKGROUND

1. Field

The present disclosure relates to a laser diode driver for a multilevel optical signal and a multilevel optical signal transmission device including the same.

2. Description of the Related Art

With the introduction of 5G mobile communication, the spread of high-quality services, and the spread of Internet of Things (IoT) equipment, a bandwidth required for optical communication used in subscriber networks and metro networks is also increasing rapidly.

In an optical communication method, the required bandwidth increases rapidly, but until now, an NRZ modulation method that divides the intensity of an optical signal into two stages, '1' or '0' has been used. However, when NRZ communication is used for 25 Gbps, 50 Gbps, and 100 Gbps ultra-wideband communication, there is a difficulty in development due to a bit conversion time in an ultra-second unit of a femtosecond level. Due to this background, several studies have recently been conducted to apply a modulation method (e.g., Pulse Amplitude Modulation 4 (PAM4), etc.) using a multilevel optical signal capable of transmitting a plurality of data through a single signal transmission.

A modulation method using a multilevel optical signal such as PAM4 has an advantage of transmitting a plurality of data at once, but also has a disadvantage that requires a complicated structured driver (laser diode driver).

SUMMARY

Provided are devices capable of transmitting multilevel optical signals through a simple structured laser diode driver (LDD).

According to an aspect of the disclosure, A laser diode driver comprises a clock generator configured to generate and output a clock signal, a first latch configured to delay output of data corresponding to a first timing of the clock signal from among data sequentially input at each data input period, a second latch configured to delay output of data corresponding to a second timing of the clock signal from among data sequentially input at each data input period, a first synchronization processor configured to output a signal corresponding to the data input by the first latch according to the clock signal, and a second synchronization processor configured to output a signal corresponding to the data input by the second latch according to the clock signal.

According to an exemplary embodiment, a period of the clock signal corresponds to twice the data input period.

According to an exemplary embodiment, the first timing corresponds to a rising edge of the clock signal.

According to an exemplary embodiment, the second timing corresponds to a falling edge of the clock signal.

According to an exemplary embodiment, the first synchronization processor and the second synchronization processor simultaneously react at either the rising edge or the falling edge of the clock signal.

According to an exemplary embodiment, the laser diode driver further comprises a first signal level determiner configured to output a voltage or current corresponding to a signal output from the first synchronization processor, and a second signal level determiner configured to output a voltage or current corresponding to a signal output from the second synchronization processor.

According to an exemplary embodiment, the laser diode driver further comprises a first switch configured to output a voltage or current corresponding to a first driving voltage in response to a signal output from the first synchronization processor, a second switch configured to output a voltage or current corresponding to a second driving voltage in response to a signal output from the second synchronization processor, and a third switch configured to output a voltage or current corresponding to a third driving voltage in response to a signal output from the second synchronization processor.

According to an aspect of the disclosure, an optical signal transmission device comprises the laser diode driver.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
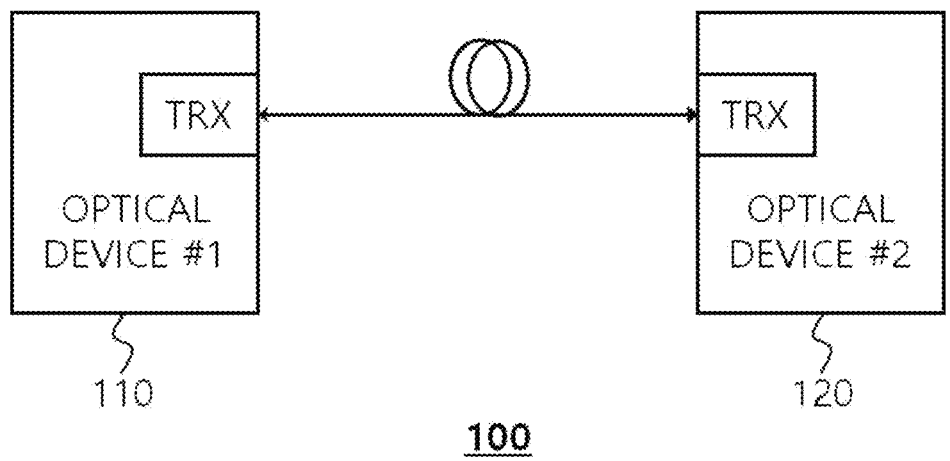
FIG. 1 is a block diagram of a multilevel optical signal transmission system according to an embodiment.

Since the disclosure may have diverse modified embodiments, preferred embodiments are illustrated in the drawings and are described in the detailed description. However, this is not intended to limit the disclosure to particular modes of practice, and it is to be appreciated that all changes, equivalents, and substitutes that do not depart from the spirit and technical scope of the disclosure are encompassed in the disclosure. In the description of the disclosure, certain detailed explanations of the related art are omitted when it is deemed that they may unnecessarily obscure the essence of the disclosure.

It will be understood that, although the terms "first", "second", etc. may be used herein to describe various elements, these elements should not be limited by these terms. These terms are used only to differentiate an element from another element.

The terms used in this application, only certain embodiments have been used to describe, is not intended to limit the disclosure. An expression used in the singular encompasses the expression of the plural, unless it has a clearly different meaning in the context. Also, it will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. Hereinafter, embodiments of the disclosure will be described in detail with reference to the accompanying drawings.

FIG. 1 is a block diagram of a multilevel optical signal transmission system according to an embodiment.

Referring to FIG. 1, a multilevel optical signal transmission system 100 according to an embodiment may include a first optical signal transmission device 110 and a second optical signal transmission device 120. The first optical signal transmission device 110 and the second optical signal transmission device 120 are connected to each other through an optical cable to transmit and receive optical signals to each other. For example, the first optical signal transmission device 110 may be a central office terminal (COT) that multiplexes a baseband signal and transmits the multiplexed baseband signal to one or more connected remote terminals (RTs), and the second optical signal transmission device 120 may be an RT connected to the COT.

In an embodiment, the first optical signal transmission device 110 and/or the second optical signal transmission device 120 may transmit and receive a multilevel optical signal. The multilevel optical signal may be an optical signal generated by a pulse amplitude modulation 4 (PAM4) method. Hereinafter, a specific configuration in which the first optical signal transmission device 110 and/or the second optical signal transmission device 120 generate(s) a multilevel optical signal will be described with reference to FIGS. 2 to 4.

Figure 2:
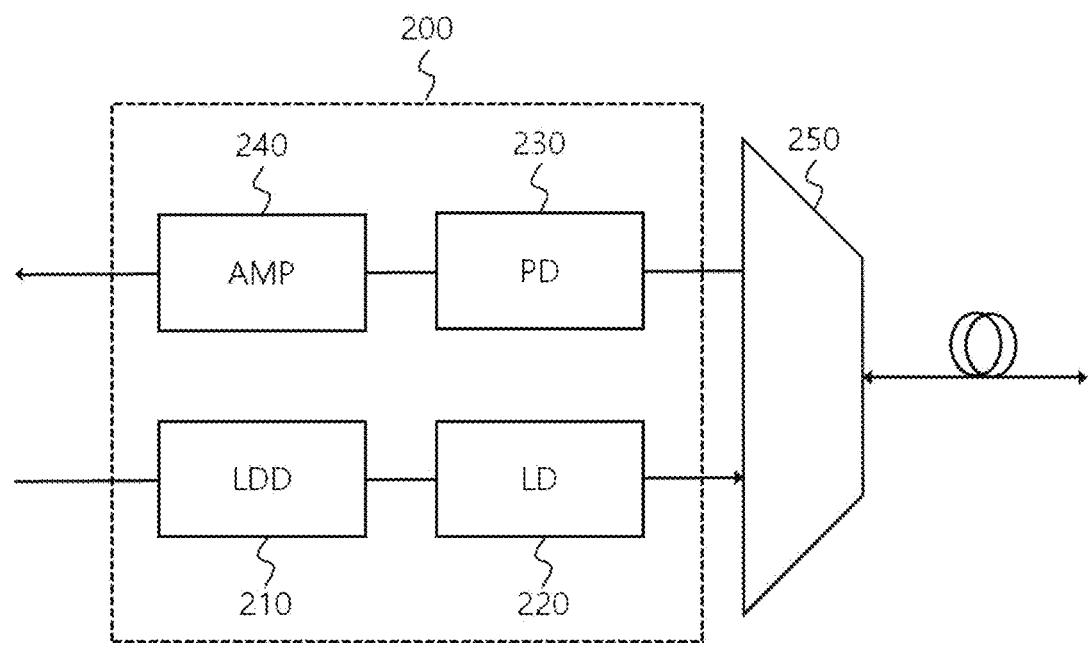
FIG. 2 is a block diagram of a multilevel optical signal transmission device according to an embodiment.

FIG. 2 is a block diagram of a multilevel optical signal transmission device according to an embodiment.

Referring to FIG. 2, the optical signal transmission device 110 or 120 according to an embodiment may include an optical module 200 and a multiplexer (MUX) 250. The MUX 250 may transmit a multilevel optical signal received by the optical module 200 to an optical cable. Also, the MUX 250 may output the received multilevel optical signal from the optical cable to the optical module 200.

The optical module 200 may include a laser diode driver (Hereinafter abbreviated as LDD) 210, a laser diode (LD) 220, a photo diode (PD) 230, and an amplifier (AMP) 240.

The PD 230 may convert a multilevel optical signal received by the MUX 250 into an electrical signal and output the electrical signal, and the amplifier 240 may amplify the electrical signal input from the photodiode 230 and output the amplified signal to a processor (not shown). The processor (not shown) may process the signal output from the amplifier 240 according to a preset method.

In addition, the LDD 210 may determine a level corresponding to sequentially input data, and the LD 220 may generate an optical signal corresponding to the level of the input data in the LDD 210. Hereinafter, the configuration of the LDD 210 will be described in detail with reference to FIG. 3.

Figure 3:
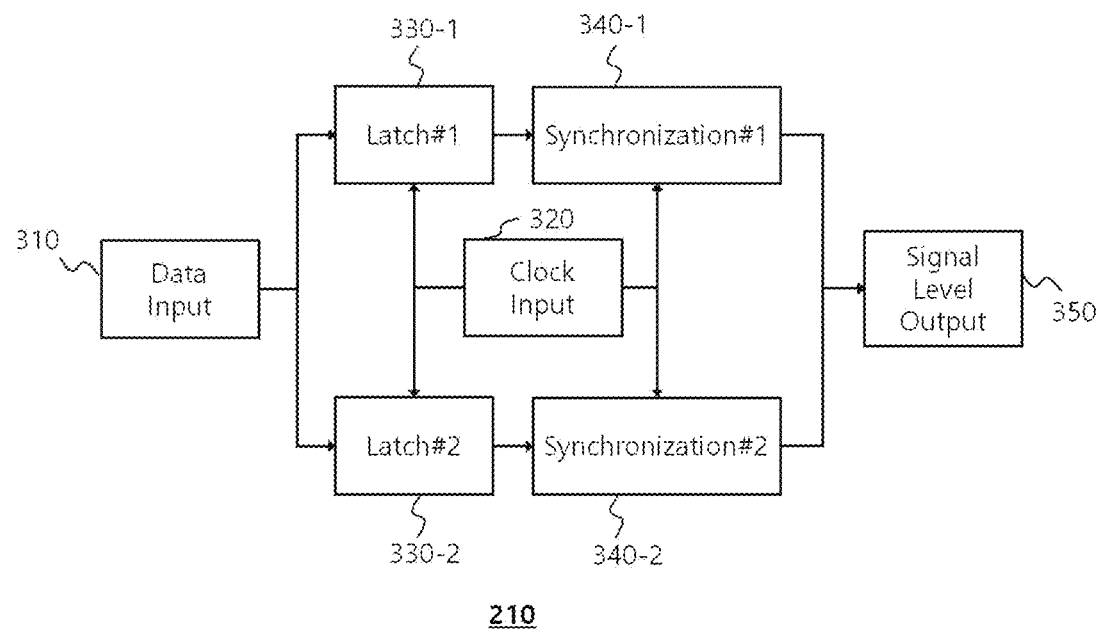
FIG. 3 is a block diagram of a laser diode driver according to an embodiment.

FIG. 3 is a block diagram of an LDD according to an embodiment.

Referring to FIG. 3, the LDD 210 according to an embodiment may include a data input terminal 310, a clock generator 320, a first latch (Latch #1) 330-1, a second latch (Latch #2) 330-2, a first synchronization processor (Synchronization #1) 340-1, a second synchronization processor (Synchronization #2) 340-2, and a signal level determiner 350.

The data input terminal 310 may output sequentially input data to the first latch 330-1 and the second latch 330-2, respectively. In this case, the data may be input by 1 bit at a period of a preset time (hereinafter referred to as 'data input period'). For example, when the data input period is 1 [us], 1 bit of data may be input to the data input terminal 310 every 1 [us]. The data input through the data input terminal 310 may output to the first latch 330-1 and the second latch 330-2 each time the data input period arrives. That is, the same data may be input to the first latch 330-1 and the second latch 330-2 in every data input period.

The first latch 330-1 may delay output of data corresponding to a clock signal input from the clock generator 320 from among data sequentially input from the data input terminal 310 at each data input period. For example, the first latch 330-1 may delay output of data corresponding to a first timing of the clock signal. The first timing may correspond to a 'rising edge' of the clock signal.

In addition, the second latch 330-2 may delay output of data corresponding to a clock signal input from the clock generator 320 from among data sequentially input from the data input terminal 310 at each data input period. For example, the second latch 330-2 may delay output of data corresponding to a second timing of the clock signal. The second timing may correspond to a 'falling edge' of the clock signal.

Hereinafter, an embodiment of a clock signal and a data input period according to an embodiment will be described with reference to FIG. 4.

Figure 4:
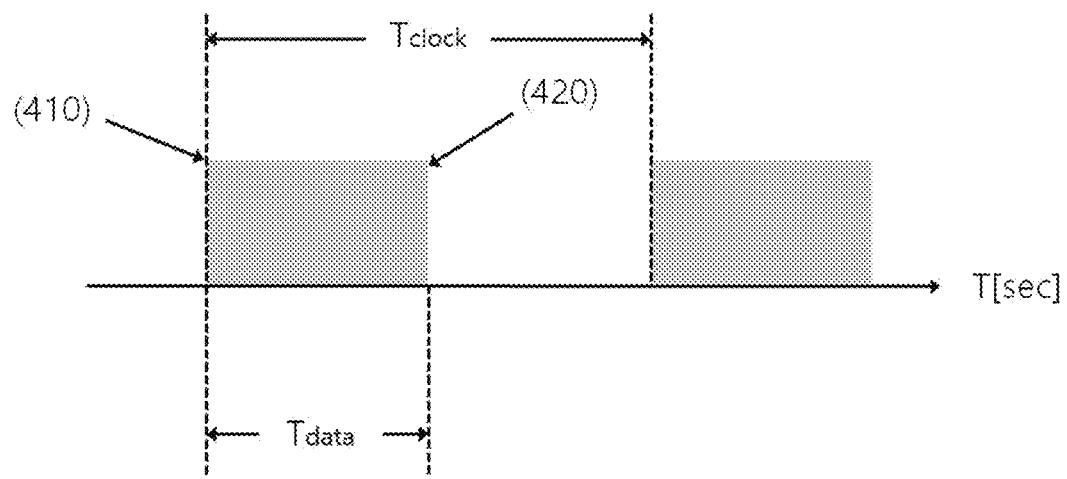
FIG. 4 is a view for explaining a clock signal according to an embodiment.

FIG. 4 is a view for explaining a clock signal according to an embodiment.

Referring to FIG. 4, the clock signal according to an embodiment may be a signal generated by the clock generator 320. A period of the clock signal may be a preset Tclock[sec]. Accordingly, the clock generator 320 may generate the same signal every Tclock[sec].

The clock signal may include both a timing 410 when a voltage rises and a timing 420 when a voltage falls within a single period. The former is referred to as a first timing, that is, a rising edge 410, and the latter is referred to as a second timing, that is, a falling edge 420.

In addition, a clock signal period Tclock may be an integer multiple of a data input period Tdata. For example, the clock signal period Tclock may be twice the data input period Tdata. In this case, 2 bits of data may be input to the data input terminal 310 during the clock signal period.

Referring again to FIG. 3, it is assumed that the data input period Tdata is half of the clock signal period Tclock. That is, it is assumed that 2 bits of data may be processed for each clock signal period.

The first latch 330-1 may store input data when the rising edge 410 of the clock signal is recognized (i.e., when a voltage of the clock signal rises), and may output the stored input signal and store next input data when the next rising edge 410 is recognized. That is, the first latch 330-1 may process data input/output in response to only the rising edge 410 of the clock signal. In this case, the first latch 330-1 may be implemented to include a general flip-flop.

Also, the second latch 330-2 may store input data when the falling edge 420 of the clock signal is recognized (i.e., when the voltage of the clock signal falls), and may output the stored input signal and store next input data when the next falling edge 420 is recognized. That is, the second latch 330-2 may process data input/output in response to only the falling edge 420 of the clock signal. In this case, the second latch 330-2 may be implemented to include a general flip-flop.

As described above, the first latch 330-1 and the second latch 330-2 according to an embodiment are designed to respond to different timings of the same clock signal, so that multiple bits of data (2 bits in the example above) may be processed using a single clock signal.

In addition, the first synchronization processor 340-1 may store input data when a clock signal is recognized, and output the stored data when the next clock signal is recognized. In this case, the first synchronization processor 340-1 may output the stored data according to the timing of either the rising edge 410 or the falling edge 420 of the clock signal.

In addition, the second synchronization processor 340-2 may store input data when a clock signal is recognized, and may output the stored data when the next clock signal is recognized. At this time, the second synchronization processor 340-2 outputs the stored data according to the timing of either the rising edge 410 or the falling edge 420 of the clock signal, but may output the stored data according to the same timing as that of the first synchronization processor 340-1. Accordingly, the first synchronization processor 340-1 and the second synchronization processor 340-2 simultaneously output data, but the second synchronization processor 340-2 may output data immediately following the data output from the first synchronization processor 340-1.

That is, if it is called data No. 1 to No. 10 in the order of input from a 10-bit data column, the first synchronization processor 340-1 and the second synchronization processor 340-2 output data at the same time, but the first synchronization processor 340-1 may output data No. 1, and the second synchronization processor 340-2 may output data No. 2. Also, through the next clock signal, the first synchronization processor 340-1 and the second synchronization processor 340-2 simultaneously output data, but the first synchronization processor 340-1 may output data No. 3, and the second synchronization processor 340-2 may output data No. 4.

At this time, the first synchronization processor 340-1 and the second synchronization processor 340-2 may be implemented to include a general flip-flop.

Thereafter, the signal level determiner 350 may determine the level of a multilevel optical signal by using data output from the first synchronization processor 340-1 and the second synchronization processor 340-2. Hereinafter, a circuit configuration of the LDD 210 according to an embodiment, in particular, the signal level determiner 350 will be described in detail with reference to FIG. 5.

Figure 5:
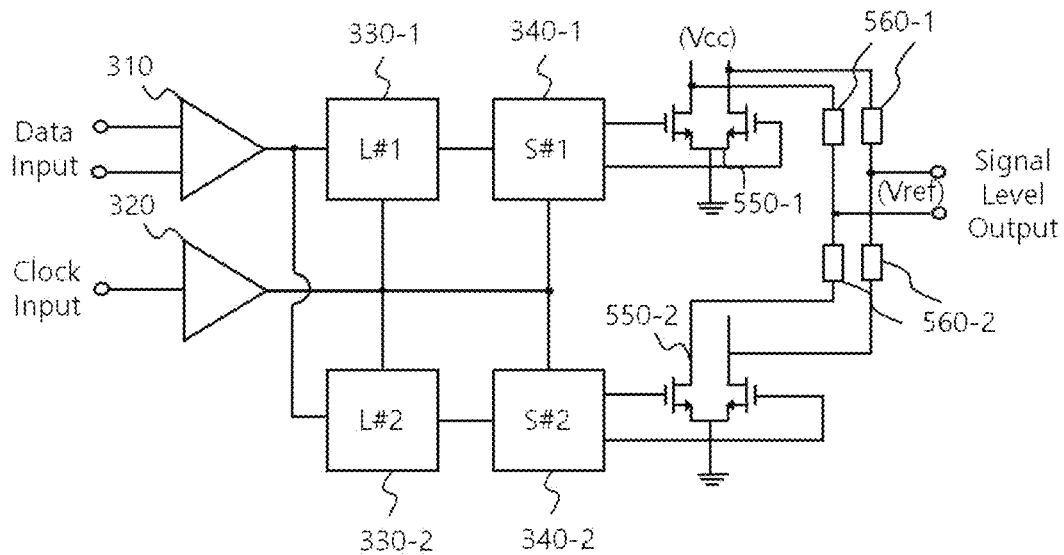
FIG. 5 is a circuit diagram of a laser diode driver according to an embodiment.

FIG. 5 is a circuit diagram of an LDD according to an embodiment.

Referring to FIG. 5, the signal level determiner 350 may include a first signal level determiner 550-1 and a second signal level determiner 550-2. A first impedance 560-1 may be formed between a terminal to which a driving voltage Vcc of the first signal level determiner 550-1 is applied and an output terminal (Signal Level Output). Also, a voltage Vref corresponding to the output terminal is applied as a driving voltage of the second signal level determiner 550-2, but a second impedance 560-2 may be formed between the second signal level determiner 550-2 and the output terminal.

A signal output from the first synchronization processor 340-1 may be input to the first signal level determiner 550-1. The first signal level determiner 550-1 may be formed such that a voltage corresponding to the signal input by the first synchronization processor 340-1 is applied to the output terminal (Signal Level Output).

In addition, a signal output from the second synchronization processor 340-2 may be input to the second signal level determiner 550-2. The second signal level determiner 550-2 may be formed such that a voltage corresponding to the signal input by the second synchronization processor 340-2 is applied to the output terminal (Signal Level Output).

For example, the first signal level determiner 550-1 and the second signal level determiner 550-2 may be formed to output 3 [V] to the output terminal when a signal corresponding to '1' is output from the first synchronization processor 340-1 and a signal corresponding to '1' is output from the second synchronization processor 340-2.

In addition, the first signal level determiner 550-1 and the second signal level determiner 550-2 may be formed to output 2 [V] to the output terminal when a signal corresponding to '1' is output from the first synchronization processor 340-1 and a signal corresponding to '0' is output from the second synchronization processor 340-2.

In addition, the first signal level determiner 550-1 and the second signal level determiner 550-2 may be formed to output 1 [V] to the output terminal when a signal corresponding to '0' is output from the first synchronization processor 340-1 and a signal corresponding to '1' is output from the second synchronization processor 340-2.

The first signal level determiner 550-1 and the second signal level determiner 550-2 may be formed to output 0 [V] to the output terminal when a signal corresponding to '0' is output from the first synchronization processor 340-1 and a signal corresponding to '0' is output from the second synchronization processor 340-2.

The first signal level determiner 550-1 and/or the second signal level determiner 550-2 may be implemented like the circuit illustrated in FIG. 5, or may be implemented through another circuit capable of implementing the above functions. Accordingly, circuits implementing the first signal level determiner 550-1 and/or the second signal level determiner 550-2 cannot limit the scope of the disclosure.

Figure 6:
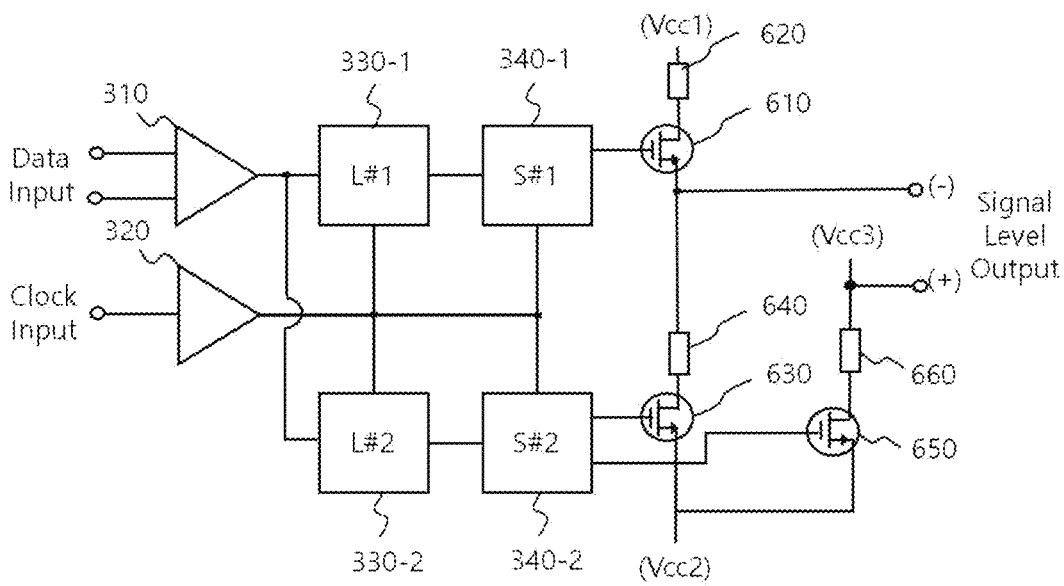
FIG. 6 is a circuit diagram of a laser diode driver according to an embodiment.

FIG. 6 is a circuit diagram of a LDD according to another embodiment.

Referring to FIG. 6, a signal output from the first synchronization processor 340-1 may be input to a first switch 610. The first switch 610 may be formed such that a voltage corresponding to the signal input by the first synchronization processor 340-1 is applied to an output terminal (Signal Level Output) according to a preset first driving voltage Vcc1. For example, the first switch 610 may be formed to output a voltage or current corresponding to the first driving voltage Vcc1 when a value corresponding to '1' is input from the first synchronization processor 340-1. On the contrary, the first switch 610 may be formed to output a voltage or current corresponding to '0' when a value corresponding to '0' is input by the first synchronization processor 340-1.

In addition, a signal output from the second synchronization processor 340-2 may be input to a second switch 630 and a third switch 650. The second switch 630 may be formed such that a voltage corresponding to a signal input by the second synchronization processor 340-2 is applied to the output terminal according to a preset second driving voltage Vcc2. For example, the second switch 630 may be formed to output a voltage or current corresponding to the second driving voltage Vcc2 when a value corresponding to '1' is input by the second synchronization processor 340-2. On the contrary, the second switch 630 may be formed to output a voltage or current corresponding to '0' when a value corresponding to '0' is input by the second synchronization processor 340-2.

In addition, the third switch 650 may be formed such that a voltage corresponding to the signal input by the second synchronization processor 340-2 is applied to the output terminal according to a preset third driving voltage Vcc3. For example, the third switch 650 may be formed to output a voltage or current corresponding to the third driving voltage Vcc3 when a value corresponding to '1' is input by the second synchronization processor 340-2. On the contrary, the third switch 650 may be formed to output a voltage or current corresponding to '0' when a value corresponding to '0' is input by the second synchronization processor 340-2.

In the example of FIG. 6, the first driving voltage Vcc1 may correspond to −1[V], the second driving voltage Vcc2 may correspond to 0 [V], and the third driving voltage Vcc3 may correspond to 2 [V]. That is, the first driving voltage Vcc1 may be formed with a voltage lower than those of the second driving voltage Vcc2 and the third driving voltage Vcc3.

Hereinafter, the operation of the LDD illustrated in FIG. 6 will be described.

First, when a signal corresponding to '1' is output from the first synchronization processor 340-1 and a signal corresponding to '1' is output from the second synchronization processor 340-2, 3[V] may be output to an output terminal.

In addition, when a signal corresponding to '1' is output from the first synchronization processor 340-1 and a signal corresponding to '0' is output from the second synchronization processor 340-2, 1[V] may be output to the output terminal.

In addition, when a signal corresponding to '0' is output from the first synchronization processor 340-1 and a signal corresponding to '1' is output from the second synchronization processor 340-2, 2[V] may be output to the output terminal.

In addition, when a signal corresponding to '0' is output from the first synchronization processor 340-1 and a signal corresponding to '0' is output from the second synchronization processor 340-2, 0[V] may be output to the output terminal.

The first switch 610, the second switch 630, and the third switch 650 may be implemented like the circuit illustrated in FIG. 6, or may be implemented through another circuit capable of implementing the above functions. Accordingly, circuits implementing the first switch 610, the second switch 630, and the third switch 350 cannot limit the scope of the disclosure.

In addition, the impedances 620, 640, and 660 respectively connected to the first switch 610, the second switch 630, and the third switch 350 may be implemented as a device having an appropriate impedance value through resistance or the like.

As described above, the LDD 210 according to an embodiment may be a latch or a synchronization processor (flip-flop) operating at half the processing speed of a conventional NRZ-modulated laser diode driver. Therefore, it is obvious that the LDD 210 of the disclosure is easier to implement than the conventional NRZ-modulated laser diode driver and also increases transmission efficiency.

An optical signal transmission device according to the disclosure may transmit a multilevel optical signal through a simple structured laser diode driver (LDD).

While the embodiments have been particularly shown and described, it will be understood by one of ordinary skill in the art that various changes in form and details may be made therein without departing from the spirit and scope of the disclosure as defined by the appended claims.

The invention claimed is:

1. A laser diode driver comprising:
   a clock generator configured to generate and output a clock signal;
   a first latch configured to delay output of data corresponding to a first timing of the clock signal from among data sequentially input at each data input period;
   a second latch configured to delay output of data corresponding to a second timing of the clock signal from among data sequentially input at each data input period;
   a first synchronization processor configured to output a signal corresponding to the data input by the first latch according to the clock signal; and
   a second synchronization processor configured to output a signal corresponding to the data input by the second latch according to the clock signal.

2. The laser diode driver of claim 1, wherein a period of the clock signal corresponds to twice the data input period.

3. The laser diode driver of claim 1, wherein the first timing corresponds to a rising edge of the clock signal.

4. The laser diode driver of claim 1, wherein the second timing corresponds to a falling edge of the clock signal.

5. The laser diode driver of claim 1, wherein the first synchronization processor and the second synchronization processor simultaneously react at either the rising edge or the falling edge of the clock signal.

6. The laser diode driver of claim 1, further comprising:
   a first signal level determiner configured to output a voltage or current corresponding to a signal output from the first synchronization processor; and
   a second signal level determiner configured to output a voltage or current corresponding to a signal output from the second synchronization processor.

7. The laser diode driver of claim 1, further comprising:
   a first switch configured to output a voltage or current corresponding to a first driving voltage in response to a signal output from the first synchronization processor;
   a second switch configured to output a voltage or current corresponding to a second driving voltage in response to a signal output from the second synchronization processor; and
   a third switch configured to output a voltage or current corresponding to a third driving voltage in response to a signal output from the second synchronization processor.

8. An optical signal transmission device comprising the laser diode driver of claim 1.

* * * * *